(12) United States Patent
Park et al.

(10) Patent No.: US 12,171,114 B2
(45) Date of Patent: Dec. 17, 2024

(54) DISPLAY APPARATUS

(71) Applicant: LG Display Co., Ltd., Seoul (KR)

(72) Inventors: Minsoo Park, Incheon (KR); Sang-Il Shin, Paju-si (KR); Jaechang Kang, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/419,122

(22) Filed: Jan. 22, 2024

(65) Prior Publication Data
US 2024/0215296 A1 Jun. 27, 2024

Related U.S. Application Data

(63) Continuation of application No. 17/343,123, filed on Jun. 9, 2021, now Pat. No. 11,917,852.

(30) Foreign Application Priority Data

Jun. 30, 2020 (KR) .................. 10-2020-0080319

(51) Int. Cl.
*H10K 50/844* (2023.01)
*H10K 59/131* (2023.01)

(52) U.S. Cl.
CPC ......... *H10K 50/844* (2023.02); *H10K 59/131* (2023.02)

(58) Field of Classification Search
CPC .... H10K 50/844; H10K 59/131; H10K 59/00; H10K 50/84; H10K 71/00; H10K 59/65; H10K 50/8426; H01L 27/124
See application file for complete search history.

(56) References Cited

U.S. PATENT DOCUMENTS

| 7,247,881 | B2 | 7/2007 | Lee et al. |
| 9,929,226 | B2 | 3/2018 | Im et al. |
| 10,186,566 | B2 | 1/2019 | Im et al. |

(Continued)

FOREIGN PATENT DOCUMENTS

| CN | 1622715 A | 6/2005 |
| CN | 106711169 A | 5/2017 |

(Continued)

OTHER PUBLICATIONS

China National Intellectual Property Administration, Office Action, Chinese Patent Application No. 202110737739.0, Apr. 30, 2024, 15 pages.

(Continued)

*Primary Examiner* — Kyoung Lee
(74) *Attorney, Agent, or Firm* — Fenwick & West LLP

(57) ABSTRACT

Provided is a display apparatus according to an exemplary embodiment of the present disclosure which includes a substrate including a display area and at least one non-display area; a light emitting device and a plurality of transistors disposed in the display area of the substrate; and a power wiring disposed in the at least one non-display area and electrically connected to the plurality of transistors and the light emitting device. The at least one non-display area includes a camera hole area and a disconnection area, and the disconnection area has a closed loop shape to surround the camera hole area. Therefore, provided is a display apparatus that is more stable for permeation of moisture and oxygen.

14 Claims, 10 Drawing Sheets

(56) References Cited

U.S. PATENT DOCUMENTS

| | | |
|---|---|---|
| 10,541,380 B1 | 1/2020 | Sung et al. |
| 10,840,313 B2 | 11/2020 | Jang et al. |
| 10,873,053 B2 | 12/2020 | Sung et al. |
| 11,322,564 B2 | 5/2022 | Son et al. |
| 11,411,055 B2 | 8/2022 | Jang et al. |
| 11,456,440 B2 | 9/2022 | Sung et al. |
| 2005/0110023 A1 | 5/2005 | Lee et al. |
| 2017/0141176 A1 | 5/2017 | Im et al. |
| 2017/0148856 A1* | 5/2017 | Choi ................ H10K 59/873 |
| 2018/0175133 A1 | 6/2018 | Im et al. |
| 2020/0127233 A1 | 4/2020 | Sung et al. |
| 2020/0168671 A1 | 5/2020 | Jang et al. |
| 2020/0168683 A1 | 5/2020 | Son et al. |
| 2021/0036064 A1 | 2/2021 | Jang et al. |
| 2021/0111374 A1 | 4/2021 | Sung et al. |
| 2022/0384533 A1 | 12/2022 | Jang et al. |
| 2023/0014088 A1 | 1/2023 | Sung et al. |

FOREIGN PATENT DOCUMENTS

| | | |
|---|---|---|
| CN | 110875440 A | 3/2020 |
| CN | 111211145 A | 5/2020 |
| CN | 111223897 A | 6/2020 |

OTHER PUBLICATIONS

China National Intellectual Property Administration, Office Action, Chinese Patent Application No. 202110737739.0, Aug. 29, 2023, 15 pages.
United States Office Action, U.S. Appl. No. 17/343,123, filed Jun. 21, 2023, 11 pages.

* cited by examiner

DISPLAY APPARATUS

CROSS-REFERENCE TO RELATED APPLICATIONS

This application is a continuation of U.S. patent application Ser. No. 17/343,123 filed on Jun. 9, 2021, which claims the priority of Republic of Korea Patent Application No. 10-2020-0080319 filed on Jun. 30, 2020, in the Korean Intellectual Property Office, each of which is incorporated herein by reference in its entirety.

BACKGROUND

Field

The present disclosure relates to a display apparatus, and more particularly, to a display apparatus in which a camera hole is disposed.

Description of the Related Art

With the recent trend toward the information age, display fields that visually display electrical information signals have been rapidly developed. In this regard, various display apparatuses having excellent properties such as slimness, light weight, and low power consumption have been developed.

Specific examples of the display apparatus may include a liquid crystal display (LCD) apparatus, an organic light emitting diode (OLED) display apparatus, a quantum dot display apparatus, and the like.

The display apparatus may include a display panel and many components for providing various functions. For example, in the existing display apparatus, a camera and various optical sensors are disposed outside the display panel and perform various functions such as photographing, face recognition, and infrared distance measurement. However, as generations pass, so-called bezel-less or bezel-free designs, which seem to have a full display area when a user looks at a display apparatus, are increasingly common, making it difficult to dispose the camera and the optical sensors outside the display panel. In order to achieve the bezel-less or bezel-free design, studies have been conducted to move the camera and the optical sensors inward an active area of the display panel. As the result according to the studies, a technology called a hole-in display has been developed to form a hole in the display panel and dispose the camera and the optical sensors inside the hole in the display panel.

As the hole-in display is developed and all the camera and the sensors disposed in the existing bezel area move to the inside of the display panel area, the ultimate bezel-less or bezel-free designs may be applied to the display apparatus.

SUMMARY

The present disclosure reduces a space for disposing a camera and various sensors in recent smart devices. In order to dispose the camera and the sensors, a part of a front surface of the display area in the smart devices need to be provided for the camera and the sensors, and accordingly, the display area of the display panel is reduced. Moreover, the various types of cameras and sensors tend to be disposed on the front surface of the display area, and thus it is necessary to further overcome the limitation of the display area. For example, various components, such as a front wide-angle camera, a depth camera, and a face recognition sensor or an infrared distance measurement sensor, may be disposed on a front surface of the display apparatus. Therefore, a side effect of reducing an aesthetic sense occurs due to enlarging of a non-display area for disposing the components. The hole-in display is developed for disposing the camera and the sensors on the front surface of the display area while maintaining the display area, but a side effect also occurs due to the hole-in display. In order to implement the hole-in display, the inventors have recognized that it is necessary to suppress occurrence of cracks and permeation of moisture into the camera hole area and various technologies for this are required.

Accordingly, the present disclosure describes a new structure for suppressing the permeation of moisture and oxygen through an organic light emitting stack while suppressing cracks due to transfer of thermal energy generated when a substrate is cut using a laser, and a manufacturing method.

For example, in the present disclosure the thermal energy is transferred through the substrate when a laser is irradiated to a cut part of the substrate, and such thermal energy may cause deformation in organic insulating films or inorganic insulating films that are sequentially disposed from the display area. The deformation thus generated may be gradually increased to form cracks due to the phenomenon of stress concentration at a defect portion of the substrate. The cracks thus formed have a characteristic that the cracks are easily propagated through an insulating film, particularly, an inorganic insulating film, such that the cracks may be propagated to the display area of the display panel and display performance may deteriorate. In order to suppress the cracks generated due to the deformation, an area from which the organic insulating film or the inorganic insulating film are removed may be set to be spaced apart from a laser irradiation area by a certain distance. Therefore, even if the substrate is removed by the laser, a substrate having a low thermal conductivity absorbs all the generated thermal energy and does not transfer the thermal energy to the organic insulating film or the inorganic insulating film. Thus, it may suppress cracks from occurring due to the deformation of the insulating films.

The present disclosure describes a characteristic that when moisture permeates through the organic light emitting stack exposed during formation of the camera hole area, the moisture is reacted and propagated along the organic light emitting stack. The propagated moisture may reach a pixel disposed in the display area of the display panel, resulting in deterioration of the display performance. A new structure for suppressing the propagation of moisture through the organic light emitting stack is disclosed. An area in which the organic light emitting stack is disconnected may be set in the vicinity of the camera hole area by using the characteristic formed through chemical vapor deposition during formation of the organic light emitting stack. Therefore, it is possible to suppress moisture and oxygen introduced from the camera hole area from being transferred from the area in which the organic light emitting stack is disconnected to the display area in the display panel. By disposing an area in which the organic light emitting stack is cut in the vicinity of the camera hole area, it is possible to suppress propagation of moisture and oxygen into the display area of the display panel.

A foreign material compensation layer of an encapsulation layer for protecting the organic light emitting device may be suppressed from overflowing into the camera hole area, and by disposing a structure for suppressing interference between the camera or the sensors to be disposed in the camera hole area and the foreign material compensation layer, a defect such as lifting generated when the structure is coupled to an upper substrate or contamination of a camera may be reduced.

As for a design of the bezel-less or bezel-free display panel, which is the development trend of the display apparatus, it may be important to suppress deterioration in display quality while disposing a hole for disposing the camera and the sensors in the display area.

According to an aspect of the present disclosure, a display apparatus includes: a substrate including a display area and at least one non-display area; a light emitting device and a plurality of transistors disposed in the display area on the substrate; and a power wiring disposed in the non-display area and electrically connected to the plurality of transistors and the light emitting device, in which the at least one non-display area includes a camera hole area and a disconnection area, and the disconnection area has a closed loop shape to surround the camera hole area.

According to another aspect of the present disclosure, a display apparatus includes: a substrate including a light emitting device and a plurality of transistors; a camera hole disposed in the vicinity of the light emitting device and the plurality of the transistors; and at least one disconnection portion and at least one dam disposed to surround the camera hole, in which the at least one disconnection portion include at least one disconnection structure, and the at least one dam and the at least one disconnection structure are disposed alternatively with each other.

Other detailed matters of the exemplary embodiments are included in the detailed description and the drawings.

According to an exemplary embodiment of the present disclosure, it is possible to provide a display apparatus in which the camera hole area may be disposed inside the display area of the display panel, such that the whole appearance of the display panel is a slim bezel or a narrow bezel.

Therefore, a user of the display apparatus may use an aesthetic device having a full light emission screen on the front surface of the display apparatus and use a compact module that is functionally applied to a narrow bezel, such that a display apparatus with excellent grip and light weight may be provided to the user.

In the display apparatus according to an exemplary embodiment of the present disclosure, it is possible to suppress the permeation of moisture and oxygen introduced from the camera hole by forming a plurality of disconnection areas at a periphery of the camera hole. The disconnection area may cut off the connection with the organic common layer of the light emitting device disposed on the front surface of the display panel, that is, the light emitting stack, thereby blocking a movement path of moisture and oxygen.

In the organic material deposition process for forming the light emitting stack, based on straightness of the organic material, a vertical structure of the structure in the disconnection area may be increased, thereby forming long side portions or forming the different widths of the side portions of the structure in the disconnection area. The organic material may not be stacked or may be unevenly stacked in an area that is not shown in the deposition direction of the organic material or on the side portion perpendicular to the deposition direction, through the side portions of the structure in the disconnection area. Therefore, the material constituting the light emitting stack may not be stacked on the side portion of the structure in the disconnection area or may be unevenly stacked, thereby structurally separating the light emitting stack.

The plurality of dams and the plurality of structures are disposed in the disconnection area, such that it is possible for the foreign material compensation layer of the encapsulation layer not to overflow into the camera hole. The plurality of dams and the plurality of structures may suppress contamination of the camera hole area and interference with the camera to be disposed in the camera hole area, which may occur when the foreign material compensation layer overflows into the camera hole.

When the disconnection structure is disposed around the dam disposed in the disconnection area, more structures may be disposed in the structure adjacent to the dam, thereby forming a higher structure than other structures. As a result, the foreign material compensation layer capable of overflowing in the vicinity of the dam may be suppressed by complementing the disconnection structure.

An organic material layer may be further disposed in the structure disposed in the disconnection area, such that the height of the structure may be increased or a wider area to be shielded when organic material is deposited may be formed to ensure the separation of the light emitting stack.

The effects according to the present disclosure are not limited to the contents exemplified above, and more various effects are included in the present specification.

It is to be understood that both the foregoing general description and the following detailed description are exemplary and explanatory and are intended to provide further explanation of the inventive concepts as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
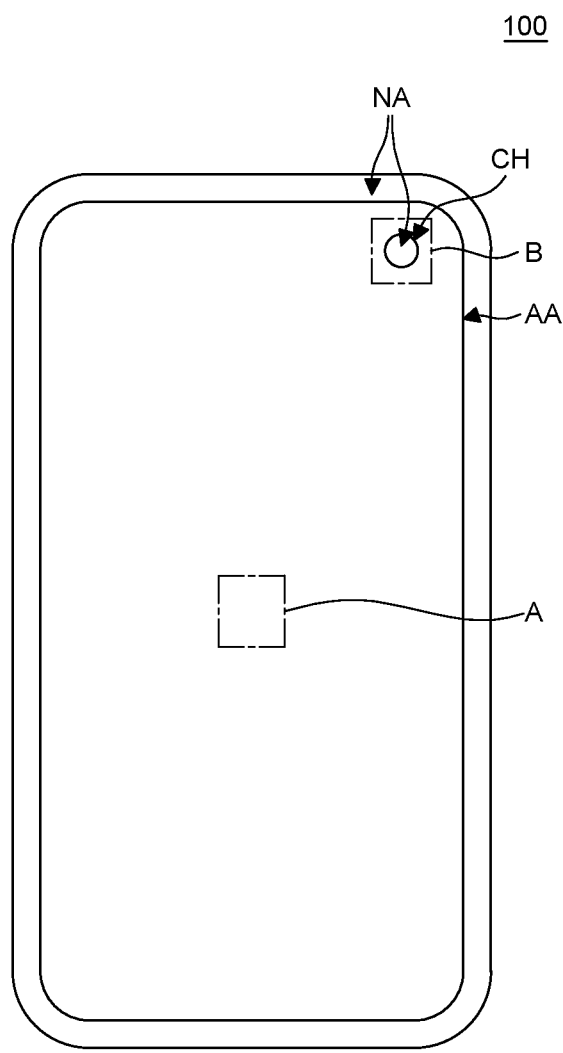
FIG. 1 is a view illustrating a front surface of a display panel according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the time sequence between two or more incidents is described using the terms such as "after", "subsequent to", "next to", and "before", two or more incidents may be inconsecutive unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element is not limited by the terms. It will be understood that when an element described as being "connected", "coupled", or "adhered" to another element, the element may be directly connected or adhered to the other element or layer, but the other element or layer may be "disposed" between elements, or elements may be "connected", "coupled", or "adhered" to each other through the other element.

The "display apparatus" herein may be used to encompass a display apparatus in the narrow sense including a display panel and a driving unit for driving the display panel, such as a liquid crystal module (LCM), an organic light emitting diode (OLED) module, and a quantum dot module. In addition, the display apparatus herein may also include an equipment display apparatus including a complete product or a final product including LCM, OLED, QD module, or the like, for example, a notebook computer, a television, a computer monitor, an automotive display, or other displays of a vehicle, and a set electronic device or a set apparatus (set device) such as a mobile electronic device such as a smart phone or an electronic pad.

Accordingly, the display apparatus herein may include an application product or a set apparatus such as a final product including the LCM, OLED, and QD module as well as a display apparatus itself in the narrow sense such as LCM, OLED, and QD module.

If necessary, the LCM, OLED, and QD modules provided with the display panel, the driving unit, and the like may be expressed as a "display apparatus" in the narrow sense, and the electronic device as the final product including the LCM, OLED, and QD modules may be expressed as a "set apparatus". For example, the display apparatus in the narrow sense may include a display panel such as the LCD, OLED, and QD modules, and a source printed circuit board (source PCB) corresponding to a control unit for driving the display panel. In addition, in a case of the set apparatus, it may include a set PCB corresponding to a set control unit, which is electrically connected with the source PCB, so as to control the entire set apparatus.

A display panel applied to the present exemplary embodiments may use any type of display panel, such as a liquid crystal display panel, an organic light emitting diode (OLED) display panel, a quantum dot (QD) display panel, and an electroluminescent display panel. The display panel of the present embodiment is not limited to a specific display panel including a flexible substrate for OLED display panel and a back plate support structure under the substrate and capable of bending a bezel. Further, the display panel applied to the display apparatus according to an exemplary embodiment of the present disclosure is not limited to a shape or a size thereof.

More specifically, if the display panel is the OLED display panel, the display panel may include a plurality of gate lines, a plurality of data lines, and a plurality of pixels respectively formed in intersections of the gate lines and the data lines. In addition, the display panel may include an array including a thin film transistor configured to selectively apply a voltage to each of the pixels, an OLED layer on the array, an encapsulation substrate or an encapsulation layer disposed on the array to cover the OLED layer, and the like. The encapsulation layer may protect the thin film transistor and the OLED layer against external impacts and suppress permeation of moisture and oxygen into the OLED layer. In addition, a layer formed on the array may include an inorganic light emitting layer, such as a nano-sized material layer or a quantum dot.

In the present disclosure, FIG. 1 illustrates an exemplary organic light emitting diode (OLED) display panel 100 that may be integrated into the display apparatuses.

FIG. 1 is a plan view of the display panel 100 according to an exemplary embodiment of the present disclosure. FIG. 1 illustrates an exemplary organic light emitting diode (OLED) display panel 100 that may be integrated into the display apparatuses. Referring to FIG. 1, in the OLED display panel 100, a hole CH for a camera and a sensor is disposed in a display area AA, to reduce a bezel area, which is a non-display area, and maximize the display area AA. A product with a design that maximizes the display area AA may be more aesthetically pleasing due to maximizing a user's immersion in a viewing image.

One hole CH for a camera and a sensor is disposed as illustrated in FIG. 1, but the present disclosure is not limited thereto, and a plurality of holes CH for a camera and a sensor may be disposed. For example, one or two holes are disposed inside the display area AA. A camera may be disposed in the first hole, and a distance sensing sensor or a face recognition sensor and a wide view-angle camera may be disposed in the second hole.

Figure 2:
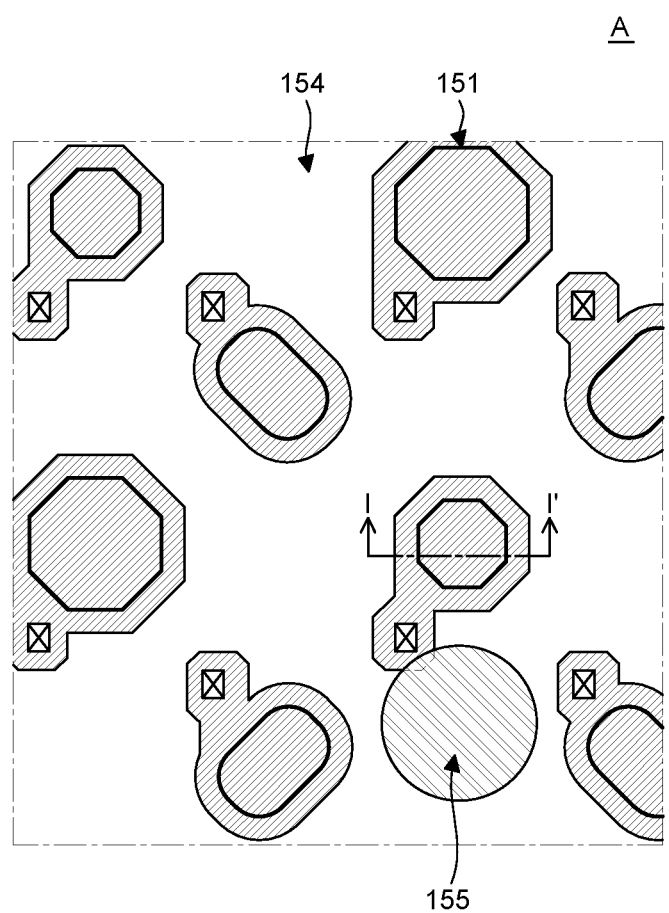
FIG. 2 is a plan view illustrating a display area by enlarging an A area in FIG. 1 according to an exemplary embodiment of the present disclosure.

FIG. 2 illustrates an enlarged A area which is a part of the display area AA of the display panel 100, and illustrates subpixels disposed in the display area AA in plane.

In FIG. 2, a plurality of anodes 151 are disposed in the display area AA, and an area between the anode 151 and the anode 151 is filled with a bank 154. The bank 154 may be disposed to cover edges of the anode 151, and serve to define a light emission area of the subpixel by bringing only an intermediate area of the anode 151 into contact with the organic light emitting stack. A spacer 155 may be disposed in a part of the area where the bank 154 is disposed. The spacer 155 may be disposed to have a certain density in the whole display panel 100. When a deposition process is performed to form the organic light emitting stack, the spacer 155 may serve to support a mask for deposition that shields or opens an organic layer for each subpixel so that the mask is not in direct contact with the display panel 100. FIG. 2 illustrates a pentile type plane structure in which the subpixels are disposed in a dot pattern as an example, but the present disclosure is not limited thereto, and a real type plane structure may also correspond to the example.

Figure 3:
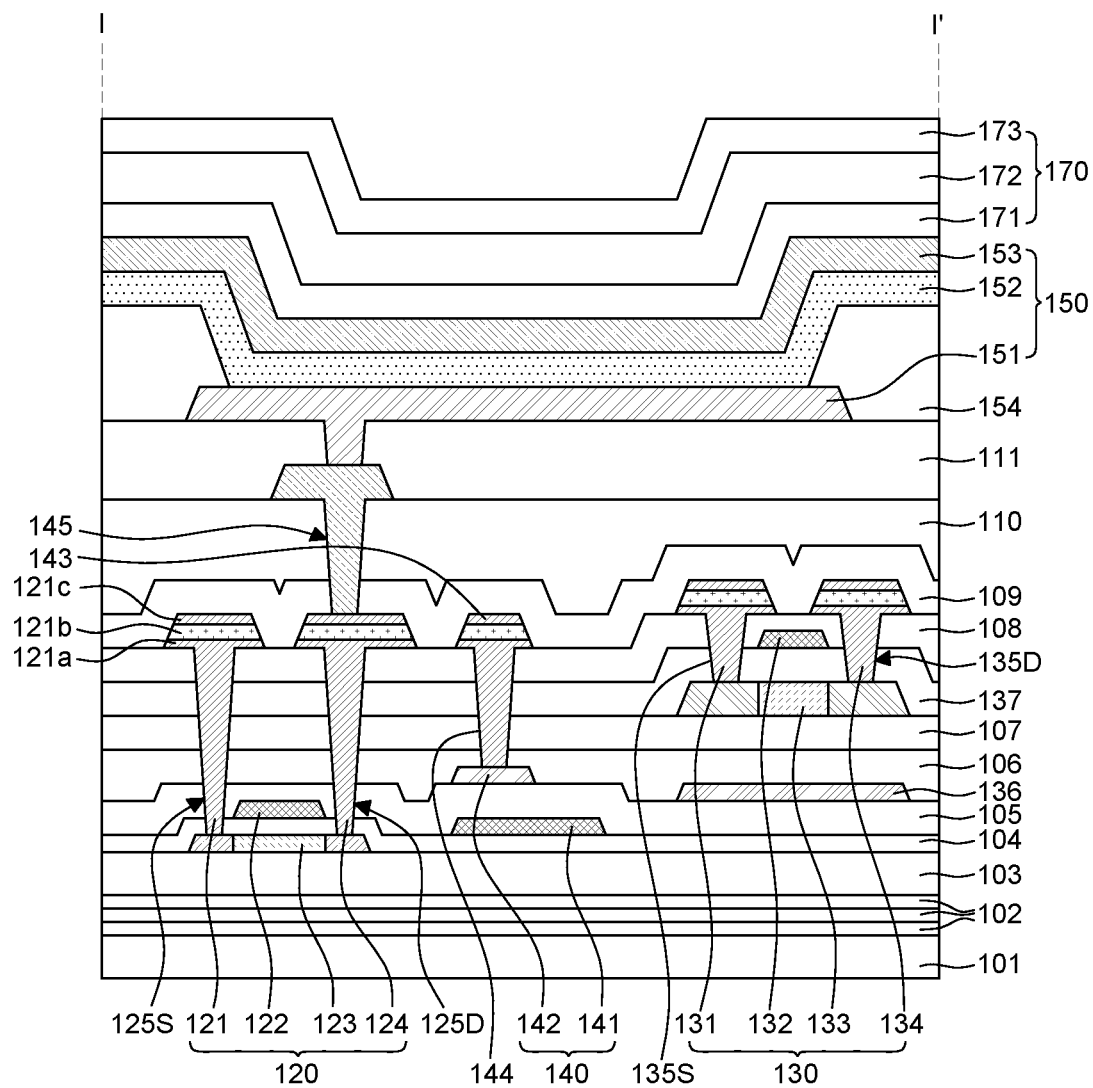
FIG. 3 is a cross-sectional view of a subpixel taken along line I-I' in FIG. 2 according to an exemplary embodiment of the present disclosure.

FIG. 3 illustrates a cross-sectional view of a subpixel taken along line I-I' in FIG. 2 according to one embodiment.

Referring to FIG. 3, the subpixel may include a substrate 101, a multi-buffer layer 102, and a lower buffer layer 103, and a first transistor 120 may be disposed on the lower buffer layer 103. A first semiconductor layer 123 constituting the first transistor 120 may be disposed on the lower buffer layer 103, and a lower gate insulating film 104 for insulating the first semiconductor layer 123 and a first gate electrode 122 may be disposed on the first semiconductor layer 123. A first lower interlayer insulating film 105, a second lower interlayer insulating film 106, and an upper buffer layer 107 are sequentially disposed on the first gate electrode 122.

The multi-buffer layer 102 may delay the diffusion of moisture and oxygen permeated into the substrate 101, and may be formed of silicon nitride (SiNx) and silicon oxide (SiOx) that are alternatively stacked at least once.

The lower buffer layer 103 may protect the first semiconductor layer 123, and perform a function to avoid various defects introduced from the substrate. The lower buffer layer 103 may be formed of a-Si, silicon nitride (SiNx), silicon oxide (SiOx), or the like.

The first semiconductor layer 123 of the first thin film transistor 120 may be formed of a polycrystalline semiconductor layer, and the first semiconductor layer 123 may have a channel area, a source area, and a drain area.

The polycrystalline semiconductor layer has a low energy consumption and excellent reliability because of higher mobility than an amorphous semiconductor layer and an oxide semiconductor layer. Due to the advantages, the polycrystalline semiconductor layer may be used in a driving transistor.

The first gate electrode 122 may be disposed on the lower gate insulating film 104 to overlap the first semiconductor layer 123.

A second transistor 130 may be disposed on the upper buffer layer 107, and a light-shielding layer 136 may be disposed on a lower portion of an area corresponding to the second transistor 130. Referring to FIG. 3, the light-shielding layer 136 may be disposed on the first lower interlayer insulating film 105 of the area corresponding to the second transistor 130, and the second semiconductor layer 133 of the second transistor 130 may be disposed on the second lower interlayer insulating film 106 and the upper buffer layer 107 to overlap the light-shielding layer 136. An upper gate insulating film 137 for insulating a second gate electrode 132 and the second semiconductor layer 133 may be disposed on the second semiconductor layer 133, and sequentially, an upper interlayer insulating film 108 may be disposed on the second gate electrode 132. The first gate electrode 122 and the second gate electrode 132 may be a single layer or multiple layers formed of any one of molybdenum (Mo), aluminum (Al), chromium (Cr), gold (Au), titanium (Ti), nickel (Ni), neodymium (Nd), and copper (Cu) or an alloy thereof. However, the present disclosure is not limited thereto.

The first and second lower interlayer insulating films 105 and 106 may be formed of inorganic films having a higher hydrogen particle content than the upper interlayer insulating film 108. For example, the first and second lower interlayer insulating films 105 and 106 may be formed of silicon nitride (SiNx) through a deposition process using an $NH_3$ gas, and the upper interlayer insulating film 108 may be formed of silicon oxide (SiOx). The hydrogen particles contained in the first and second lower interlayer insulating films 105 and 106 may be diffused into the polycrystalline semiconductor layer during a hydrogenation process to allow pores in the polycrystalline semiconductor layer to be filled with hydrogen. Accordingly, the polycrystalline semiconductor layer is stabilized, thereby suppressing deterioration in properties of the first transistor 120. After the activation and hydrogenation processes of the first semiconductor layer 123 of the first transistor 120, the second semiconductor layer 133 of the second transistor 130 may be formed, and at this time, the second semiconductor layer 133 may be formed as an oxide semiconductor. Since the second semiconductor layer 133 is not exposed to a high-temperature atmosphere of the activation and hydrogenation processes of the first semiconductor layer 123, damage of the second semiconductor layer 133 may be suppressed, thereby improving reliability. After the upper interlayer insulating film 108 is disposed, a first source contact hole 125S and a first drain contact hole 125D may be formed to correspond to the source and drain areas of the first transistor, respectively, and a second source contact hole 135S and a second drain contact hole 135D may be formed to correspond to the source and drain areas of the second transistor 130, respectively. Referring to FIG. 3, the first source contact hole 125S and the first drain contact hole 125D may be formed with holes continuously from the upper interlayer insulating film 108 to the lower gate insulating film 104, and the second transistor 130 may be formed with the second source contact hole 135S and the second drain contact hole 135D. A first source electrode 121 and a first drain electrode 124 corresponding to the first transistor 120, a second source electrode 131 and a second drain electrode 134 corresponding to the second transistor 130 are formed simultaneously. Therefore, the number of processes of forming the respective source and drain electrodes of the first transistor 120 and the second transistor 130 may be reduced.

The first source and drain electrodes 121 and 124 and the second source and drain electrodes 131 and 134 may be a single layer or multiple layers formed of any one of molybdenum (Mo), aluminum (Al), chromium (Cr), gold (Au), titanium (Ti), nickel (Ni), neodymium (Nd), and copper (Cu)

or an alloy thereof. However, the present disclosure is not limited thereto. The first source and drain electrodes 121 and 124 and the second source and drain electrodes 131 and 134 may be formed of a three-layered structure. For example, the first source electrode 121 may include a first layer 121a, a second layer 121b, and a third layer 121c, and other source and drain electrodes may have the same structure.

A storage capacitor 140 may be disposed between the first transistor 120 and the second transistor 130. As illustrated in FIG. 3, the storage capacitor 140 may be formed to overlap a storage lower electrode 141 and a storage upper electrode 142 with the first lower interlayer insulating film 105 interposed therebetween.

The storage lower electrode 141 is located on the lower gate insulating film 104, and may be formed on the same layer and formed of the same material as the first gate electrode 122. The storage upper electrode 142 may be electrically connected to a pixel circuit through a storage supply line 143. The storage upper electrode 142 may be formed on the same layer and formed of the same material as the light-shielding layer 136. The storage upper electrode 142 may be exposed through a storage contact hole 144 that penetrates the second lower interlayer insulating film 106, the upper buffer layer 107, the upper gate insulating film 137, and the upper interlayer insulating film 108, and connected to the storage supply line 143. On the other hand, the storage upper electrode 142 is spaced apart from the light-shielding layer 136 as illustrated in FIG. 3, but may be integrally formed to be connected to the light-shielding layer 136. The storage supply line 143 may be formed on the same surface and formed of the same material as the first source and drain electrodes 121 and 124 and the second source and drain electrodes 131 and 134. Therefore, the storage supply line 143 may be formed at the same time by the same mask process as the first source and drain electrodes 121 and 124 and the second source and drain electrodes 131 and 134.

An inorganic insulating material such as SiNx or SiOx is fully deposited on the first source and drain electrodes 121 and 124, the second source and drain electrodes 131 and 134, and the substrate 101 on which the storage supply line 143 is formed, and a protective film 109 may be thus formed. A first planarization layer 110 may be formed on the substrate 101 on which the protective film 109 is formed. Specifically, an organic insulating material such as an acrylic resin is fully applied on the substrate 101 on which the protective film 109 is formed, such that the first planarization layer 110 may be disposed on the substrate 101.

The protective film 109 and the first planarization layer 110 are disposed on the substrate 101, and a contact hole exposing the first source electrode 121 or the first drain electrode 124 of the first transistor 120 may be formed through a photolithography process. A connection electrode 145 may be disposed in a contact hole area exposing the first drain electrode 124 with a material formed of Mo, Ti, Cu, AlNd, Al, and Cr or an alloy thereof.

A second planarization layer 111 may be disposed on the connection electrode 145, and a contact hole exposing the connection electrode 145 to the second planarization layer 111 may be formed to dispose a light emitting device 150 connected to the first transistor 120.

The light emitting device 150 may include an anode electrode 151 connected to the first drain electrode 124 of the first transistor 120, at least one light emitting stack 152 formed on the anode electrode 151, and a cathode electrode 153 formed on the light emitting stack 152.

The light emitting stack 152 may include a hole injection layer, a hole transport layer, a light emitting layer, an electron transport layer, and an electron injection layer. A charge generation layer may be additionally disposed between the light emitting layers in a tandem structure in which a plurality of light emitting layers overlaps with each other. The light emitting layer may emit different colored light for each subpixel. For example, a red light emitting layer, a green light emitting layer, and a blue light emitting layer are formed separately for each subpixel. However, a common light emitting layer may be formed to emit white light for each pixel without color classification, and a color filter for classifying colors may be provided separately. Generally, the light emitting stack 152 may be provided as a common layer except that the separate light emitting layer is formed, and disposed in the same manner for each subpixel.

The anode electrode 151 may be connected to the connection electrode 145 exposed through the contact hole that penetrates the second planarization layer 111. The anode electrode 151 may be formed in a multilayer structure including a transparent conductive film and an opaque conductive film having a high reflection efficiency. For example, the transparent conductive film is formed of a material having a comparatively high work function value, such as indium-tin-oxide (ITO) or indium-zinc-oxide (IZO), and the opaque conductive film is formed to have a single layer structure or a multilayer structure including Al, Ag, Cu, Pb, Mo, and Ti, or an alloy thereof. For example, the anode electrode 151 may be formed to have a structure in which the transparent conductive film, the opaque conductive film, and the transparent conductive film are sequentially stacked, or a structure in which a transparent conductive film and an opaque conductive film are sequentially stacked. The anode electrode 151 may be disposed on the second planarization layer 111 so as to overlap not only the light emission area provided by the bank 154 but also a pixel circuit area in which the first and second transistors 120 and 130 and the storage capacitor 140 are disposed, thereby increasing the light emission area.

The light emitting stack 152 may be formed by stacking, on the anode electrode 151, the hole transport layer, the organic light emitting layer, and the electron transport layer in order or reverse order. In addition, the light emitting stack 152 may further include the charge generation layer, first and second light emitting stacks may be formed opposite to each other with charge generation layer interposed therebetween.

The bank 154 may expose the anode electrode 151. The bank 154 may be formed of an organic material such as photo-acryl, and may be formed of a translucent material. However, the present disclosure is not limited thereto, and the bank 154 may be formed of an opaque material for suppressing optical interference between the subpixels.

The cathode electrode 153 may be formed on an upper surface of the light emitting stack 152 so as to oppose the anode electrode 151 with the light emitting stack 152 interposed between the cathode electrode 153 and the anode electrode 151. In a case where the cathode electrode 153 is applied to a front side emitting type organic light emitting display apparatus, the cathode electrode 153 may be formed of a transparent conductive film by thinly forming indium-tin-oxide (ITO), indium-zinc-oxide (IZO), or magnesium-silver (Mg—Ag).

The encapsulation layer 170 for protecting the light emitting device 150 may be formed on the cathode electrode 153. The light emitting device 150 may react with moisture or oxygen from outside due to properties of an organic material in the light emitting stack 152 to occur dark spots or pixel shrinkage. In order to suppress the occurrence of dark spots or pixel shrinkage, the encapsulation layer 170 may be disposed on the cathode electrode 153. The encapsulation layer 170 may include a first inorganic insulating film 171, a foreign material compensation layer 172, and a second inorganic insulating film 173.

Figure 4:
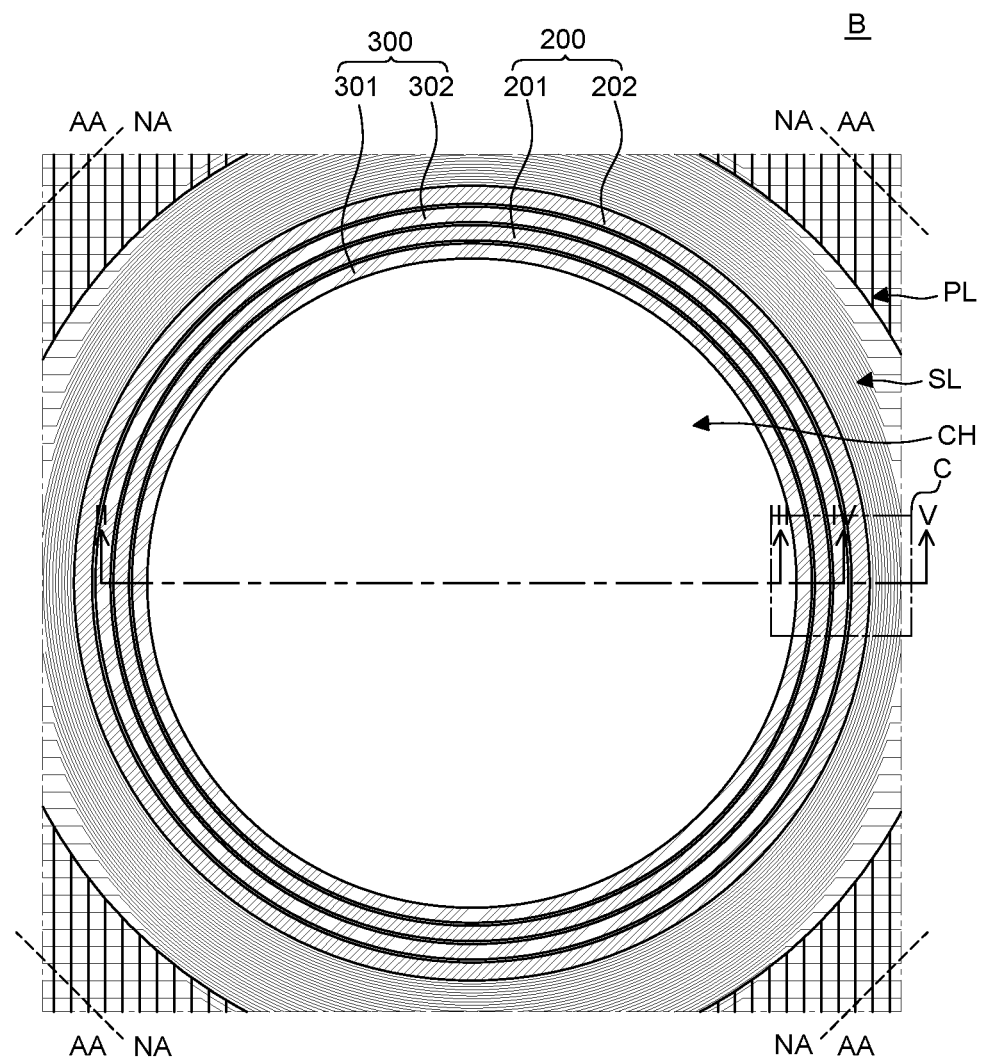
FIG. 4 is an enlarged plan view illustrating a camera hole by enlarging a B area in FIG. 1 according to an exemplary embodiment of the present disclosure.

FIG. 4 is a plan view of an enlarged B area corresponding to an area of the camera hole CH in FIG. 1 according to one embodiment. Referring to FIG. 4, there is a large circular space at the center of the B area, and a camera module may be disposed in the large circular space. The area of the camera hole CH may be removed using a laser in a panel completion step. Thus, the substrate 101 may be removed except for a part of the area of the camera hole (CH). A non-display area NA may be disposed between the area of the camera hole CH and the display area AA. A dam structure 300 and a disconnection structure 200 may be disposed around the area of the camera hole CH in the non-display area NA. Referring to FIG. 4, the dam structure 300 may include a first dam 301 and a second dam 302, and the disconnection structure 200 may include a first disconnection portion 201 and a second disconnection portion 202. The first dam 301, the first disconnection portion 201, the second dam 302, and the second disconnection portion 202 may be sequentially disposed around the area of the camera hole CH. In general, the dam structure 300 is to suppress the foreign material compensation layer 172, which is a part of the encapsulation layer 170, from flowing from an outer portion of the display panel 100 to an end of the outer portion of the display panel 100 to maintain adhesion between an upper substrate and a lower substrate constituting the display panel 100. In order to protect the light emitting device 150, for example, in order to suppress the foreign material compensation layer 172 of the encapsulation layer 170 from overflowing into or being leaked from the area of the camera hole CH, the dam structure 300 at a periphery of the area of the camera hole CH may be formed by a plurality of structures such as the first dam 301 and the second dam 302. The present disclosure proposes two dams, but is not limited thereto, and additional dams may be disposed according to the spatial disposition. Referring to FIG. 4, the first disconnection portion 201 and the second disconnection portion 202 may be disposed inside the first dam 301 and the second dam 302, respectively. The first disconnection portion 201 and the second disconnection portion 202 may be disposed for protecting the light emitting device 150 in the display area from moisture or oxygen introduced into the area of the camera hole CH. The light emitting stack 152 for the light emitting device 150 may be deposited on the front surface of the display panel 100, and also uniformly deposited on the area of the camera hole CH. The light emitting stack 152 has high reactivity and high propagation to moisture and oxygen due to properties of an organic material, and may thus transfer moisture and oxygen to the light emitting device 150 of the display area AA. To suppress the transfer of moisture and oxygen, the first and second disconnection portions 201 and 202 may be configured to partially disconnect the light emitting stack 152. The detailed description thereof will be described with reference to FIGS. 6 to 8. The present disclosure describes two disconnection structures, but is not limited thereto.

Various wirings may be disposed in the non-display area NA in the vicinity of the area of the camera hole CH, in addition to the dam structure 300 and the disconnection structure 200. Although the light emitting device 150 and the pixel circuit are removed from the corresponding area due to the disposition of the area of the camera hole CH, the light emitting device 150 and the pixel circuit need to be electrically connected to upper, lower, left, and right sides of the area of the camera hole CH. To this end, high potential power wirings PL, gate wirings SL, and the like may be disposed in the non-display area NA in the vicinity of the area of the camera hole CH so as to bypass the area of the camera hole CH and connect to the upper, lower, left, and right sides.

Figure 5:
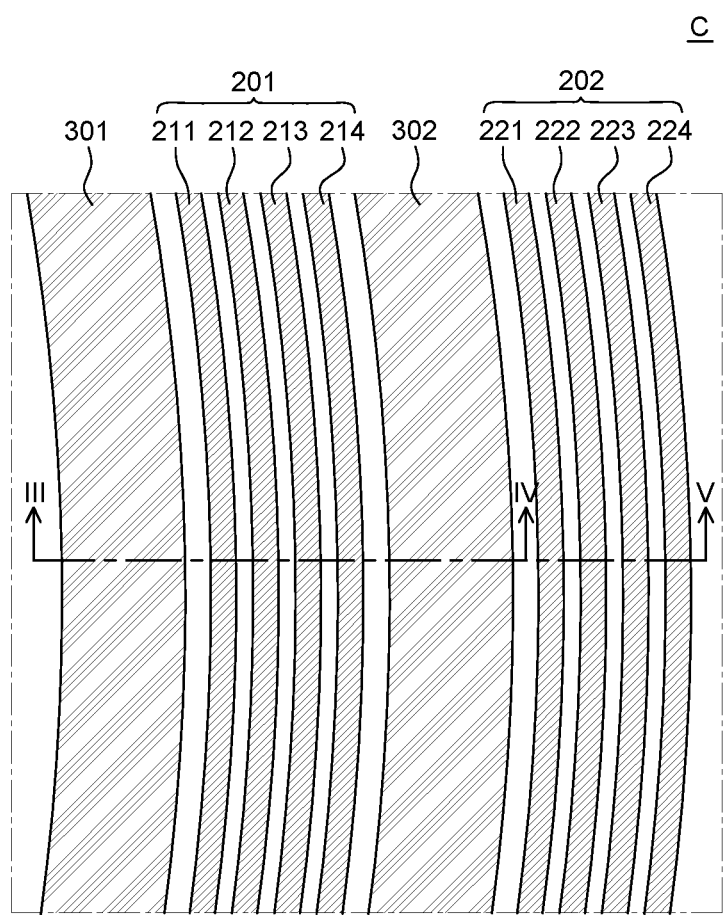
FIG. 5 is a plan view of a periphery of the camera hole by enlarging a C area in FIG. 4 according to an exemplary embodiment of the present disclosure.

FIG. 5 is a plan view of an enlarged C area outside the area of the camera hole CH in FIG. 4 according to one embodiment. Referring to FIG. 5, the first disconnection portion 201 may be disposed between the first dam 301 and the second dam 302, and the second disconnection portion 202 may be disposed on a right side of the second dam 302. The first disconnection portion 201 may include a first structure 211, a second structure 212, a third structure 213, and a fourth structure 214, and the second disconnection portion 202 may include a fifth structure 221, a sixth structure 222, a seventh structure 223, and an eighth structure 224. Referring to FIGS. 4 and 5, the first dam 301, the second dam 302, the first disconnection portion 201, and the second disconnection portion 202 are disposed around the area of the camera hole CH in a closed loop shape. This is because if any one portion of the first dam 301, the second dam 302, the first disconnection portion 201, and the second disconnection portion 202 disposed in a closed loop shape penetrates, moisture and oxygen may permeate from the outside to the display area AA, or conversely, the foreign material compensation layer 172 may overflow from the inside to the area of the camera hole CH. Referring to FIG. 5, each of the first disconnection portion 201 and the second disconnection portion 202 may be composed of four structures, but the present disclosure is not limited thereto. For example, each of the first disconnection portion 201 and the second disconnection portion 202 may be composed of five structures. In addition to the first disconnection portion 201 and the second disconnection portion 202, disconnection portions may be additionally disposed on a left side of the first dam 301 and at a portion adjacent to the area of the camera hole CH. In addition to the first dam 301 and the second dam 302, a dam may be additionally disposed in the non-display area NA on the right side of the second disconnection portion 202. The first to eighth structures 211, 212, 213, 214, 221, 222, 223, and 224 included in the disconnection portion may have a line width of about 3 to 10 μm but the present disclosure is not limited thereto.

Figure 6:
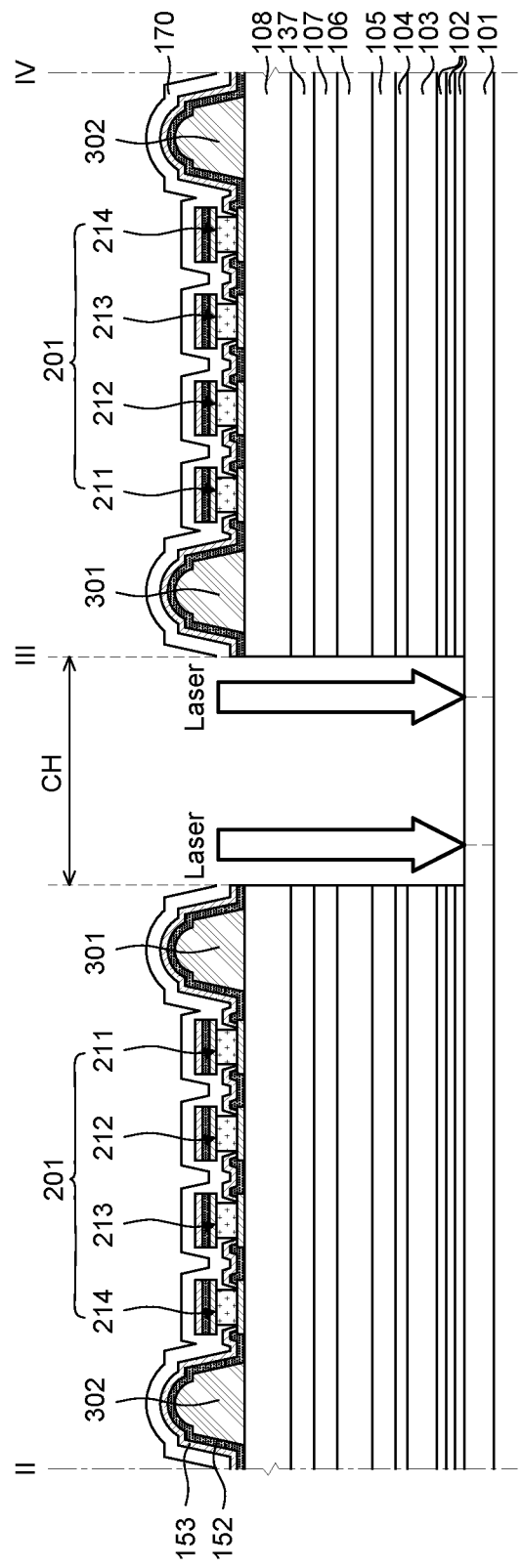
FIG. 6 is a cross-sectional view of a camera hole area taken along line II-IV in FIG. 4 according to an exemplary embodiment of the present disclosure.

FIG. 6 is a cross-sectional view illustrating a structure of the camera hole area taken along line II-IV in FIG. 4 according to one embodiment. The first dam 301 and the second dam 302 may be disposed around the area of the camera hole CH in a closed loop shape, and the first disconnection portion 201 may be disposed between the first dam 301 and the second dam 302 in a closed loop shape. When looking at the cross section in the vicinity of the area of the camera hole CH, various insulating films present in the substrate 101 and the display area AA may be disposed. For example, the multi-buffer layer 102, the lower buffer layer 103, the first lower interlayer insulating film 105, the second lower interlayer insulating film 106, the upper buffer layer 107, the upper interlayer insulating film 108, and the like may be sequentially stacked on the substrate 101. The area of the camera hole CH may vary depending on a size of a camera to be applied to the product. The corresponding area is illustrated as an empty space, but some insulating films or a wiring structure may be disposed in the corresponding area. However, the corresponding area is a dummy area that does not remain in the final product when the area of the camera hole CH is removed by a laser, and thus separate expressions thereof will be omitted. The laser may be irradiated in a circular shape or an elliptical shape according to a shape of the area of the camera hole CH, and all the areas on the substrate other than the substrate 101 may be removed through the laser irradiation. The actual area of the camera hole CH and a laser irradiation area may differ from each other. For example, the laser irradiation area may be an area of about 100 μm inward from the area of the camera hole CH. As such, since the laser irradiation area and the area of the camera hole CH differ from each other, the insulating layer in the area of the camera hole CH may not be damaged during laser irradiation. A picosecond laser or a femtosecond laser may be used as the laser, but the present disclosure is not limited thereto. The laser, which uses stimulated light generated by applying energy to a specific material to amplify it, is used for communication, medical, and industrial purposes because it has characteristics, like radio waves, and directivity with respect to monochromatic light. Using the laser may form a pattern at a desired part and easily remove the specific part. The picosecond laser and the femtosecond laser described above may be divided based on an irradiation time of the laser. A picosecond and a femtosecond are a unit of the time. The picosecond is one trillionth ($10^{-12}$ sec) of a second and the femtosecond is one quadrillionth ($10^{-15}$ sec) of a second, which are too short time to be recognized by a person. The reason for dividing the laser in a time unit is because a time when a pulse of the picosecond laser is irradiated is one trillionth of a second, and a time when a pulse of the femtosecond laser is irradiated is one quadrillionth of a second. The laser forms or removes the pattern using energy, and when the energy of the laser is irradiated onto a subject, the thermal energy melts the subject to form a pattern. As the time when the pulse is irradiated is longer, a thermal effect in which the energy is transferred to the vicinity of a portion in which the pattern is formed may occur. The thermal effect may cause the heat to be accumulated around the laser irradiation area of the subject, thereby being burned, or deformed to the larger surrounding area than the set pattern by the heat. When an area irradiated by the laser overlaps or is adjacent to the insulating film, due to the characteristics of the laser, the insulating film may also be deformed by the thermal energy of the laser. Cracks may occur due to the deformation of the insulating film, and the cracks propagate through the insulating film, such that separation of the insulating film may occur, thereby causing permeation of moisture and oxygen. For example, in order to suppress the deformation or separation of the insulating film such as the multi-buffer layer 102, the lower buffer layer 103, the first lower interlayer insulating film 105, the second lower interlayer insulating film 106, the upper buffer layer 107, and the upper interlayer insulating film 108, all the insulating films may be removed at a distance of about 100 μm from a laser irradiation position. Referring to FIG. 6, the entire width of the first dam 301 or the second dam 302 may be about 50 μm, and may have a structure of a hat shape having a gentle slope on left and right surfaces and a steep slope from the center area. For example, the width of the dams may be about 30 to 60 μm, but the present disclosure is not limited thereto. In this case, the width of the center area having a steep slope may be about 25 μm, but the present disclosure is not limited thereto. The first dam 301 or the second dam 302 may be formed by stacking the second planarization layer 111, the bank 154, and a spacer 155, but the present disclosure is not limited thereto, and the first dam 301 or the second dam 302 may be disposed to further include the first planarization layer 110 or other layers. The first to eighth structures 211, 212, 213, 214, 221, 222, 223, and 224 forming the first and second disconnection portions 201 and 202 may be formed of a metallic material, and for example, may be disposed of the same material or in the same process as the source and drain electrodes of the transistor. Specifically, each of the structures may have a triple metal-layered structure in which titanium (Ti), aluminum (Al), and titanium (Ti) are stacked in order, but the present disclosure is not limited thereto.

As in the display area AA, the encapsulation layer 170 may be disposed on an area in which the first or second dam 301 or 302 and the first disconnection portion 201 are disposed, and the encapsulation layer 170 may include the first inorganic insulating film 171, the foreign material compensation layer 172, and the second inorganic insulating film 173. However, the foreign material compensation layer 172 may be provided in a part of the area in the vicinity of the second dam 302 and may not be disposed in an area of the first dam 301. This will be described in detail with reference to FIGS. 7 and 8 to be described later.

Figure 7:
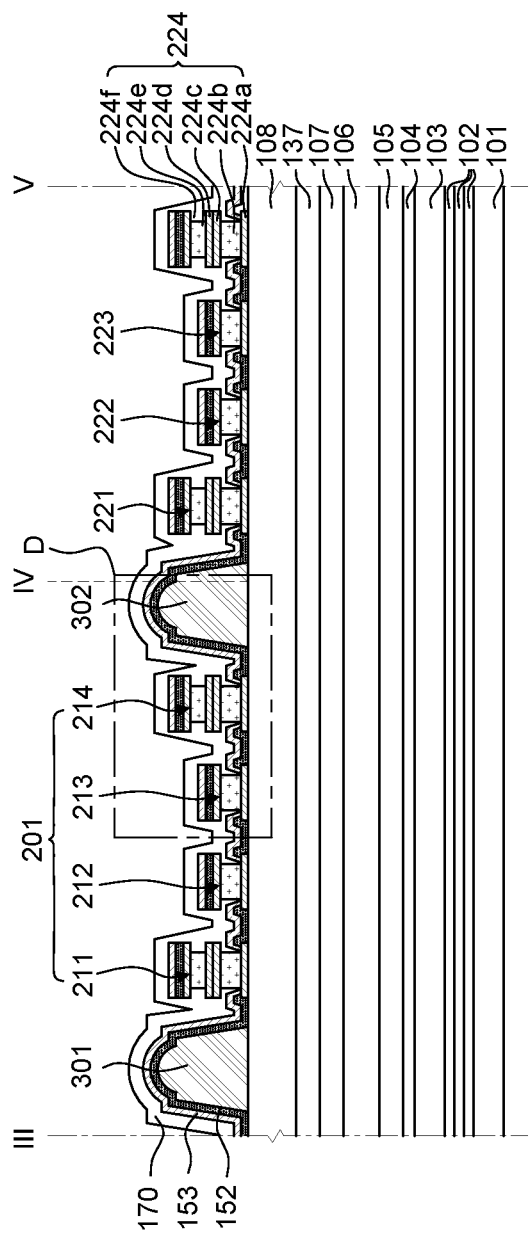
FIG. 7 is a cross-sectional view of a periphery of a camera hole according to another exemplary embodiment, taken along line III-V in FIG. 4.

FIG. 7 is a cross-sectional view taken along line III-V in FIG. 4 according to one embodiment. FIG. 7 may be another exemplary embodiment of FIG. 6. The difference between FIG. 6 and FIG. 7 may be founded in the structure adjacent to the first and second dams 301 and 302. For example, in a case of the first structure 211, the fourth structure 214, the fifth structure 221, and the eighth structure 224, the same triple metal-layered structure may be further disposed on the same triple metal-layered structure as other structures. Therefore, the first structure 211, the fourth structure 214, the fifth structure 221, and the eighth structure 224 may have heights twice those of other structures. The reason for disposing the first disconnection portion 201 or the second disconnection portion 202 is because the light emitting stack 152 that is commonly disposed in the display area AA and the non-display area NA is separated from the structures of the disconnection portions. The light emitting stack 152 may be deposited on the front surface of the display panel 100, and the side surface of the light emitting stack 152 may be exposed to the area of the camera hole CH. When moisture or oxygen from the outside permeate and diffuse through the side surface portion of the light emitting stack 152, moisture and oxygen may propagate to the light emitting device 150 of the display area AA, thereby causing performance degradation of the light emitting device 150 and defects. The structures of the first disconnection portion 201 or the second disconnection portion 202 may be disposed in order to disconnect a transfer path of moisture and oxygen by the light emitting stack 152, and the light emitting stack 152 may be physically disconnected based on shapes of the first to eighth structures 211, 212, 213, 214, 221, 222, 223, and 224 and the principle in which the light emitting stack 152 is disposed. The first structure 211, the fourth structure 214, the fifth structure 221, and the eighth structure 224 may be formed in a double structure. Thus, it is possible to ensure the structural separation of the light emitting stack 152 by a difference in height generated when the double structure is formed as described above. Specifically, the first structure 211 may be formed to be high at the outermost side which is closest from the area of the camera hole CH to ensure suppression of the permeation of moisture and oxygen from the outside, and the fourth structure 214 and the fifth structure 221 may be disposed around the second dam 302, which is spaced apart from the first dam 301, to suppress the foreign material compensation layer 172 of the encapsulation layer 170 from overflowing over the second dam 302. In a process of disposing the foreign material compensation layer 172, the foreign material compensation layer 172 having a liquid-phase material may be disposed by applying the foreign material compensation layer 172 to the front surface of the display panel 100. In this case, irregularities caused by the disposition of the second dam 302 and the plurality of structures may be a resistance due to expansion of the foreign material compensation layer 172, and may actually serve to suppress overflowing. Further, the eighth structure 224, which is a structure farthest from the area of the camera hole CH, may serve as a last line of defense that suppresses the permeation of moisture or oxygen into the display area AA. However, a position of the double structure is not necessarily limited to those of the first structure 211, the fourth structure 214, the fifth structure 221, and the eighth structure 224, and the double structure may be disposed on the second structure 212 or the sixth structure 222. For example, the eighth structure 224 may be a structure in which a first disconnection layer 224a to a sixth disconnection layer 224f are stacked in order. Here, the first disconnection layer 224a may correspond to the first layer 121a of the first source electrode 121 as illustrated in FIG. 3. The second disconnection layer 224b may correspond to the second layer 121b of the first source electrode 121. The third disconnection layer 224c may correspond to the third layer 121c of the first source electrode 121. The first disconnection layer 224a of the eighth structure 224 may include the same material as the third disconnection layer 224c, and the second disconnection layer 224b of the eighth structure 224 may include the different material from the first disconnection layer 224a and the third disconnection layer 224c of the eighth structure 224. For example, the first disconnection layer 224a and the third disconnection layer 224c of the eighth structure 224 may include titanium (Ti), and the second disconnection layer 224b of the eighth structure may include aluminum (Al).

The second disconnection layer 224b of the eighth structure 224 may have a smaller width than the first disconnection layer 224a and the third disconnection layer 224c. Accordingly, the side surface of the eighth structure 224 may have a concave shape. The concave part of the eighth structure 224 may mean a groove that is formed to be concave toward the inside of end portions of the first disconnection layer 224a and the third disconnection layer 224c by removing a part of the second disconnection layer 224b. Specifically, there is no difference in end portions between the layers when the eighth structure 224 is stacked. However, a part of the second disconnection layer 224b may be removed together with the organic insulating films in the vicinity of the area of the camera hole CH in a formation process of the first dam 301 and the second dam 302. Further, a material for forming the anode 151 may be formed on the front surface of the substrate 101, and a part of the second disconnection layer 224b may be removed together with the material for forming the anode 151 during patterning of the anode 151 so as to correspond to each light emitting device 150. That is, a part of the second disconnection layer 224b including aluminum (Al) may be removed together during etching of the first dam 301, the second dam 302, and the material for forming the anode 151, and the first disconnection layer 224a and the third disconnection layer 224c including titanium (Ti) may not be removed or removed less than the second disconnection layer 224b. A part of an upper surface of the first disconnection layer 224a and a part of a lower surface of the third disconnection layer 224c may be exposed from the end portion of the eighth structure 224 by the concave part.

Unlike the first to eighth structures 211, 212, 213, 214, 221, 222, 223, and 224, since the first source and drain electrodes 121 and 124 are covered by the protective film 109 or the first planarization layer 110 immediately after the patterning, the first source and drain electrodes 121 and 124 do not have a concave structure of the side end portion, such as the first to eighth structures 211, 212, 213, 214, 221, 222, 223, and 224. Accordingly, the side surfaces of the first layer 121a, the second layer 121b, and the third layer 121c of the first source electrode 121 may be disposed on the same line. In contrast, the first to eighth structures 211, 212, 213, 214, 221, 222, 223, and 224 may be exposed in the vicinity of the first dam 301 and the second dam 302 immediately before forming the light emitting stack 152.

When the light emitting stack 152 is disposed in an area in which the first to eighth structures 211, 212, 213, 214, 221, 222, 223, and 224 are disposed, a phenomenon that the light emitting stack 152 is partially cut off at the left and right end portions of the structure may occur. Based on the phenomenon that the light emitting stack 152 is disconnected at the end portions of the structure, as illustrated in the description of FIG. 3, the light emitting stack 152 may be disposed to be formed as a common layer for dividing it for each subpixel without the separate mask for deposition. In the first to eighth structures 211, 212, 213, 214, 221, 222, 223, and 224, for example, the eighth structure 224 may be structurally separated from the light emitting stack 152 due to a step difference in the side end portions of the second disconnection layer 224b and the third disconnection layer 224c. The light emitting stack 152 may be formed by supplying a vaporized organic material from a supply source on the substrate 101. The vaporized organic material with straightness is deposited to cover an upper surface or a side surface of the third disconnection layer 224c of the eighth structure 224, but is not formed on a side surface of the second disconnection layer 224b.

Figure 8:
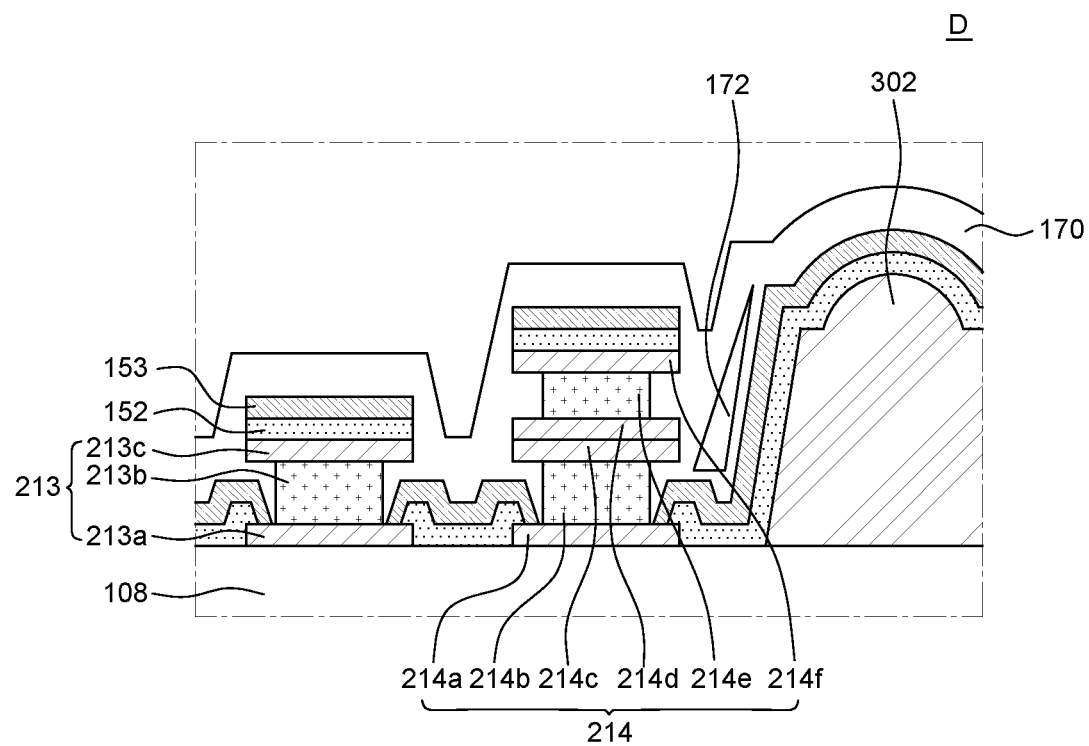
FIG. 8 is a cross-sectional view illustrating a disconnection structure and a dam area by enlarging a D area in FIG. 7 according to an exemplary embodiment of the present disclosure.

FIG. 8 is a cross-sectional view of an enlarged D area in FIG. 7 according to one embodiment. FIG. 8 illustrates the third disconnection structure 213, the fourth disconnection structure 214, the light emitting stack 152, and the cathode electrode 153, in the vicinity of the second dam 302. Referring to FIG. 8, the fourth disconnection structure 214 may be disposed, and a part of the foreign material compensation layer 172 may partially exist between the fourth disconnection structure 214 and the second dam 302. The first dam 301 and the second dam 302 are to suppress poor adhesion with the upper substrate caused by the foreign material compensation layer 172, which is a part of the encapsulation layer 170, flowing down to the outer portion of the display panel 100, in the same manner as the dam disposed in the non-display area NA on four outer portions of the display panel 100. Overflowing the foreign material compensation layer 172 into the area of the camera hole CH may cause contamination of a disposition space of the camera or interference with the camera, resulting in a serious quality problem. In order to suppress the serious quality problem, it is possible to reflect a design in which the second dam 302 suppresses overflowing of the foreign material compensation layer 172 as much as possible and the first dam 301 allows the foreign material compensation layer 172 not to overflow.

Referring to FIG. 8, a part of the foreign material compensation layer 172 overflows into the second dam 302, and does not overflow into the fourth structure 214, which may be seen from a shape of the foreign material compensation layer 172 flowing down along the second dam 302.

The light emitting stack 152 and the cathode electrode 153 may be formed on an upper surface of the third disconnection layer 213c of the third structure 213 and an upper surface of the sixth disconnection layer 214f of the fourth structure 214, and the light emitting stack 152 and the cathode electrode 153 may be separated from the side end portions of the third structure 213 and the fourth structure 214. The light emitting stack 152 and the cathode electrode 153 may be partially formed on the upper surface and the side surface of the first disconnection layer 213a of the third structure 213 and on the upper surface and the side surface of the first disconnection layer 214a of the fourth structure 214. By covering the area where the light emitting stack 152 is separated as such with the first inorganic insulating film 171 and the second inorganic insulating film 173 of the encapsulation layer 170, it is possible to block a permeation path of moisture and oxygen propagated through the light emitting stack 152 from the area of the camera hole CH.

Figure 9A:
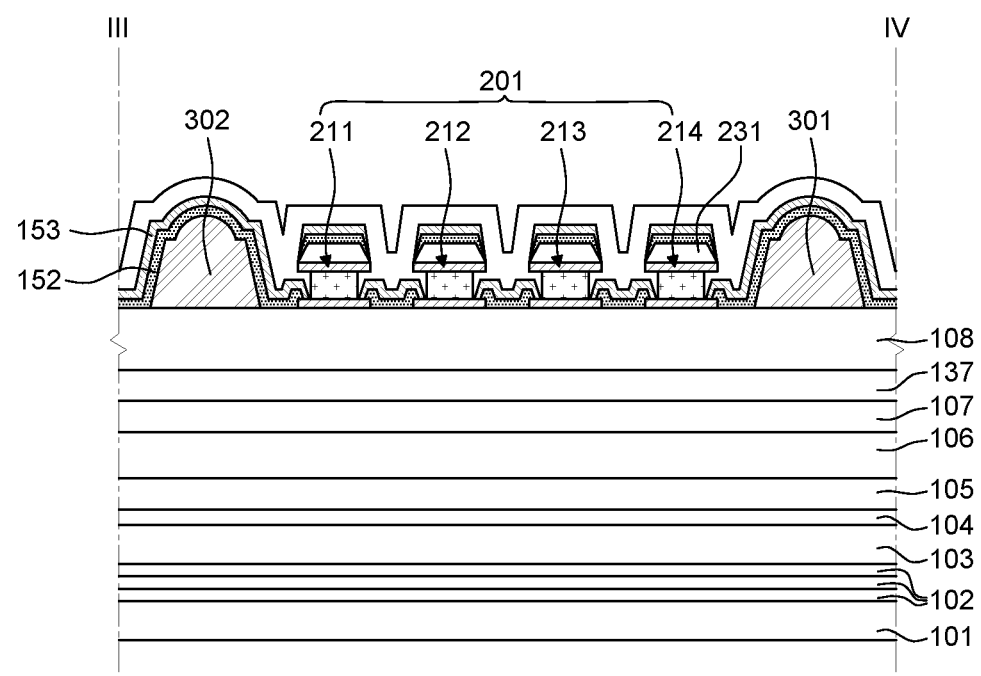
FIG. 9A is a cross-sectional view of another exemplary embodiment, taken along line III-IV in FIG. 5.
Figure 9B:
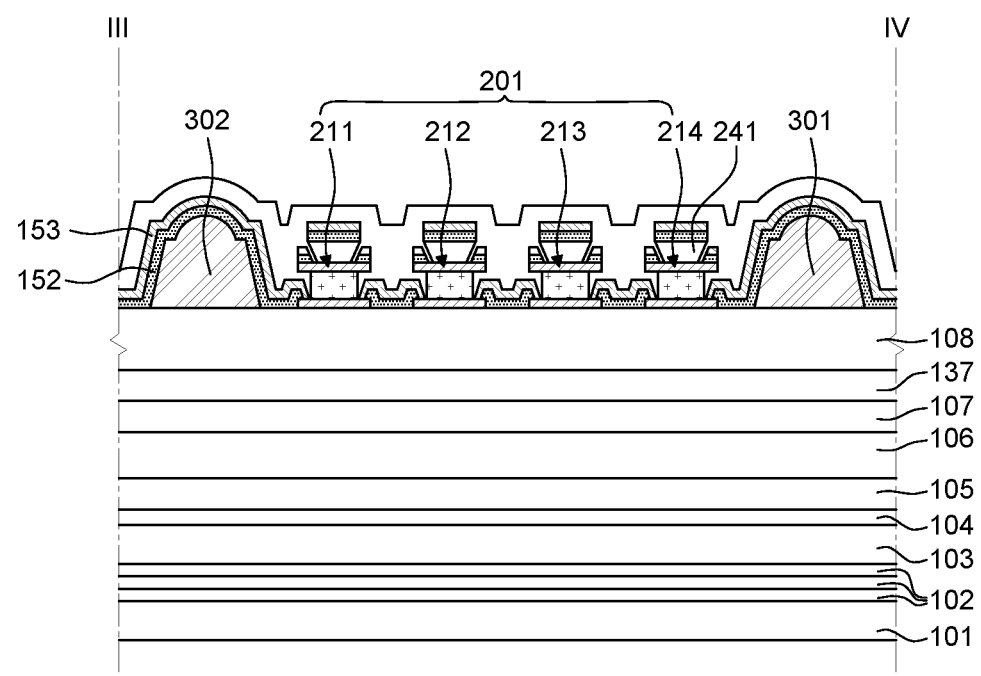
FIG. 9B is a cross-sectional view of another exemplary embodiment, taken along line III-IV in FIG. 5.

FIGS. 9A and 9B illustrate cross-sections taken along line III-IV in FIG. 5 and exemplary embodiments different from the exemplary embodiment of FIG. 6 or the exemplary embodiments of FIGS. 7 and 8. Referring to FIG. 9A, a first roof structure 231 may be further disposed on the upper portion of each of the structures forming the first disconnection portion 201. As illustrated based on the fourth structure 214, the first roof structure 231 may be a thick organic film of a trapezoidal or semicircular shape on the upper surface of the third disconnection layer 214c of the fourth structure 214. The first roof structure 231 is composed of a lower surface in contact with the third disconnection layer 214c of the fourth structure 214 and an upper surface in a direction of the encapsulation layer 170. In order to have a trapezoidal or semicircular shape, a length or area of the lower surface may be larger than a length or area of the upper surface. The length or area of the lower surface of the first roof structure 231 may be larger than the length or area of the upper surface of the third disconnection layer 214c of the fourth structure 214. As a result, the lower surface of the first roof structure 231 may be further exposed to the side portion than the upper surface of the third disconnection layer 214c of the fourth structure 214. When the first roof structure 231 is disposed on the fourth structure 214 and the light emitting stack 152 and the cathode electrode 153 are sequentially disposed, the light emitting stack 152 and the cathode electrode 153 may be stacked on the upper surface and the side portion of the first roof structure 231. In contrast, since the lower surface of the first roof structure 231 is not exposed in a depositing direction, the light emitting stack 152 may be separated from the side portion of the first roof structure 231 to the first disconnection layer 214a of the fourth structure 214.

Referring to FIG. 9B, unlike FIG. 9A, a second roof structure 241 may be further disposed on each of the structures forming the first disconnection portion 201. As illustrated based on the fourth structure 214, the second roof structure 241 may be a thick organic film of a trapezoidal shape on the upper surface of the third disconnection layer 214c of the fourth structure 214. In this case, the second roof structure 241 may have a characteristic that it may have a reverse taper structure in which the length or area of the upper surface of the structure is larger than the length or area of the lower surface. Therefore, when the light emitting stack 152 and the cathode electrode 153 are stacked, the light emitting stack 152 and the cathode electrode 153 may be disposed on the upper surface of the second roof structure 241, a part of the upper surface of the third disconnection layer 214c of the fourth structure, and a part of the upper surface and the side surface of the first disconnection layer 214a. Due to the step difference, the light emitting stack 152 and the cathode electrode 153 may be separated from the fourth structure 214.

The display apparatus according to the present disclosure includes a liquid crystal display (LCD) apparatus, a field emission display (FED) apparatus, an organic light emitting diode (OLED) display apparatus, and a quantum dot display apparatus.

The display apparatus according to an exemplary embodiment of the present disclosure may also include an equipment display apparatus including a complete product or a final product including LCM, OLED module, or the like, for example, a notebook computer, a television, a computer monitor, an automotive display apparatus, or other display apparatuses of a vehicle, and a set electronic apparatus or a set apparatus (set device) such as a mobile electronic apparatus such as a smart phone or an electronic pad.

The exemplary embodiments of the present disclosure can also be described as follows:

According to an aspect of the present disclosure, a display apparatus includes a substrate including a display area and at least one non-display area; a light emitting device and a plurality of transistors disposed in the display area of the substrate; and a power wiring disposed in the at least one non-display area and electrically connected to the plurality of transistors and the light emitting device, wherein the at least one non-display area includes a camera hole area and a disconnection area, and the disconnection area has a closed loop shape to surround the camera hole area.

The display apparatus may further include at least one dam and at least one disconnection structure disposed in the disconnection area.

The at least one non-display area further includes a wiring area through which the power wiring passes, adjacent to the camera hole area and the disconnection area.

The at least one disconnection structure may simultaneously disposed of the same material as a source electrode and a drain electrode of the transistor.

The source electrode, the drain electrode, and the disconnection structure may disposed by stacking a combination of at least two materials of titanium (Ti), molybdenum (Mo), aluminum (Al), silver (Ag), and indium-tin-oxide (ITO).

The camera hole area may include a space from which at least a part of the substrate is removed.

The dam and the disconnection structure may be disposed alternatively.

The dam may have a width of 30 to 60 μm and the disconnection structure may have a width of 3 to 10 μm.

The disconnection structure may be disposed in a three-layered structure in which a first layer, a second layer, and a third layer are stacked, and a side portion of the second layer may be disposed inward side portions of the first layer and the third layer.

The disconnection structure may be disposed in a six-layered structure by further including an additional three-layered structure in which a fourth layer, a fifth layer, and a sixth layer are stacked on the three-layered structure, and the second layer and the fifth layer may have a smaller width than other layers in the six-layered structure.

According to another aspect of the present disclosure, a display apparatus includes a substrate including a light emitting device and a plurality of transistors; a camera hole disposed in the vicinity of the light emitting device and the plurality of the transistors; and at least one disconnection portion and at least one dam disposed to surround the camera hole, wherein the at least one disconnection portion includes at least one disconnection structure, and the at least one dam and the at least one disconnection portion are disposed alternatively with each other.

The display apparatus may further include a wiring area disposed to surround the disconnection portion.

The disconnection portion may be formed of at least three disconnection structures, and the at least three disconnection structures may have a closed loop shape around the camera hole.

The camera hole may be configured to remove at least a part of the substrate.

The disconnection structure may be formed of the same material as a source electrode and a drain electrode of the plurality of transistors.

The disconnection structure may be disposed in a three-layered structure, and the side portion of an intermediate layer of the three-layered structure may be disposed inward side portions of an upper layer and a lower layer of the three-layered structure The disconnection structure may be disposed in at least three-layered structure, and at least one layer of the at least three-layered structure may be formed of an organic material.

The layer formed of the organic material may be disposed on an uppermost layer of the disconnection structure.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
a substrate including a display area on which a plurality of pixels are disposed, a camera hole in the display area, and a first non-display area between the display area and the camera hole,
wherein the first non-display area includes a disconnection area where at least one dam structure is disposed,
wherein each of the plurality of pixels includes a first transistor and a second transistor on a gate electrode of the first transistor, and a plurality of buffer layers below the first transistor and the second transistor,
wherein the plurality of buffer layers extend to the first non-display area, and
wherein the first non-display area includes a high potential power line and a gate line between the at least one dam structure and the display area.

2. The display apparatus according to claim 1, wherein the first transistor includes a first source electrode and a first drain electrode, and the second transistor includes a second source electrode and a second drain electrode,
wherein the first source electrode, the first drain electrode, the second source electrode, and the second drain electrode are disposed in a same layer.

3. The display apparatus according to claim 2, wherein the first source electrode, the first drain electrode, the second source electrode, and the second drain electrode include a stacked combination of at least two materials of titanium (Ti), molybdenum (Mo), aluminum (Al), silver (Ag), and indium-tin-oxide (ITO).

4. The display apparatus according to claim 3, wherein the first source electrode, the first drain electrode, the second source electrode, and the second drain electrode includes a three-layered metal structure.

5. The display apparatus according to claim 1, further comprising:
at least one dam and at least one disconnection structure disposed in the disconnection area.

6. The display apparatus according to claim 5, wherein the at least one dam and the at least one disconnection structure are disposed alternatively.

7. The display apparatus according to claim 1, further comprising:
an anode on the first transistor and the second transistor, the anode overlapping at least a part of the first transistor and at least a part of the second transistor.

8. The display apparatus according to claim 7, further comprising:
a bank on at least a part of the anode and a spacer on at least a part of the bank.

9. The display apparatus according to claim 8, further comprising:
a connection electrode connecting the anode and the first transistor.

10. The display apparatus according to claim 8, wherein the spacer has a constant density in the display area.

11. The display apparatus according to claim 8, wherein the at least one dam structure is on a same layer as the bank or the spacer.

12. The display apparatus according to claim 8, further comprising:
at least one insulating layer between the gate electrode of the first transistor and a second semiconductor layer of the second transistor.

13. The display apparatus according to claim 12, wherein the at least one insulating layer is in the first non-display area and the disconnection area.

14. The display apparatus according to claim 1, wherein a first semiconductor of the first transistor includes a polycrystalline semiconductor layer, and a second semiconductor of the second transistor includes an oxide semiconductor layer.

* * * * *